US012690356B2

(12) United States Patent
Jin et al.

(10) Patent No.: US 12,690,356 B2
(45) Date of Patent: Jul. 21, 2026

(54) DISPLAY DEVICE

(71) Applicant: Samsung Display Co., LTD., Yongin-si (KR)

(72) Inventors: Youyoung Jin, Yongin-si (KR); Keunchan Oh, Yongin-si (KR); Sun-Kyu Joo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 356 days.

(21) Appl. No.: 18/438,277

(22) Filed: Feb. 9, 2024

(65) Prior Publication Data

US 2025/0008806 A1 Jan. 2, 2025

(30) Foreign Application Priority Data

Jun. 30, 2023 (KR) ........................ 10-2023-0084916

(51) Int. Cl.
 *H10K 59/38* (2023.01)
 *H10K 59/127* (2023.01)
 *H10K 59/80* (2023.01)
(52) U.S. Cl.
 CPC ........... *H10K 59/38* (2023.02); *H10K 59/127* (2023.02); *H10K 59/8722* (2023.02); *H10K 59/877* (2023.02); *H10K 59/879* (2023.02)

(58) Field of Classification Search
 CPC .. H10K 59/38; H10K 59/127; H10K 59/8722; H10K 59/877; H10K 59/879; H10K 2102/331; H10K 59/873; H10K 59/8792; H10K 59/87
 See application file for complete search history.

(56) References Cited

U.S. PATENT DOCUMENTS 9,356,049 B2 * 5/2016 Ikeda .................... H10K 59/126
9,515,264 B2 * 12/2016 Sakuishi .............. H10K 77/111
9,812,517 B2 * 11/2017 Ito ........................ H10D 86/021
2023/0217774 A1 7/2023 Ji et al.

FOREIGN PATENT DOCUMENTS

KR 10-0545021 B1 1/2006
KR 10-2022-0065919 A 5/2022

* cited by examiner

*Primary Examiner* — Leonardo Andujar
(74) *Attorney, Agent, or Firm* — Womble Bond Dickinson (US) LLP

(57) ABSTRACT

A display device includes a substrate including a display area and a sealing area surrounding the display area; a color filter layer below the substrate and defining at least one trench recessed from a lower surface of the color filter layer in a direction toward the substrate in the sealing area; a refractive layer below the color filter layer; and a capping layer below the refractive layer and in contact with at least a portion of the color filter layer in the sealing area.

20 Claims, 15 Drawing Sheets

NDA

SUB1

CF1
CF2 ⟩ CF
CF3

CPL1
OL

STR1'

SPC
SM

IL
BFR ⟩ STR2'
SUB2

C

LR2

LR

LR1

TCH

SF

DR3

DR2

DISPLAY DEVICE

CROSS-REFERENCE TO RELATED APPLICATION

The present application claims priority to and the benefit of Korean Patent Application No. 10-2023-0084916, filed on Jun. 30, 2023, in the Korean Intellectual Property Office (KIPO), the entire disclosure of which is incorporated herein by reference.

BACKGROUND

1. Field

Aspects of embodiments relate to a display device that provides visual information.

2. Description of the Related Art

A display device may include a light emitting layer and a color conversion layer to improve display quality. Light may be emitted from the light emitting layer, and the color conversion layer may convert a wavelength of the light emitted from the light emitting layer. Accordingly, the color conversion layer may emit light in a wavelength band different from that of incident light.

The color conversion layer may include wavelength conversion particles such as quantum dots. For example, the color conversion layer may be divided into a red color conversion pattern, a green color conversion pattern, and a transmission pattern (or a blue color conversion pattern).

The above information disclosed in this Background section is only for enhancement of understanding of the background of the invention and therefore it may contain information that does not form the prior art.

SUMMARY

Aspects of embodiments are directed to a display device with improved display quality.

According to some embodiments of the present disclosure, there is provided to a display device including: a substrate including a display area and a sealing area surrounding the display area; a color filter layer below the substrate and defining at least one trench recessed from a lower surface of the color filter layer in a direction toward the substrate in the sealing area; a refractive layer below the color filter layer; and a capping layer below the refractive layer and in contact with at least a portion of the color filter layer in the sealing area.

In some embodiments, the refractive layer is disconnected by the trench.

In some embodiments, the refractive layer includes: a first refractive layer in the trench of the color filter layer; and a second refractive layer spaced apart from the first refractive layer and below the lower surface of the color filter layer.

In some embodiments, the refractive layer exposes a portion of the color filter layer, and the capping layer is in contact with the portion of the color filter layer exposed by the refractive layer.

In some embodiments, the color filter layer includes: a first color filter below the substrate; a second color filter below the first color filter; and a third color filter below the second color filter.

In some embodiments, the trench is recessed from a lower surface of the third color filter to a lower surface of the first color filter to expose the first color filter.

In some embodiments, the trench is recessed from a lower surface of the third color filter to a lower surface of the second color filter to expose the second color filter.

In some embodiments, the display device further includes: an organic layer below the capping layer.

In some embodiments, the capping layer includes: a first capping layer below the refractive layer; and a second capping layer below the first capping layer.

In some embodiments, the display device further includes: a scattering layer between the first capping layer and the second capping layer.

According to some embodiments of the present disclosure, there is provided to a display device including: a first substrate including a display area and a sealing area surrounding the display area; a second substrate below the first substrate and facing the first substrate; a color conversion layer between the first substrate and the second substrate and configured to convert a color of light emitted from a light emitting element that is positioned on the second substrate; a color filter layer below the first substrate and defining at least one trench recessed from a lower surface of the color filter layer in a direction toward the first substrate in the sealing area; a refractive layer below the color filter layer; and a capping layer below the refractive layer and in contact with at least a portion of the color filter layer in the sealing area.

In some embodiments, the refractive layer includes: a first refractive layer in the trench of the color filter layer; and a second refractive layer spaced apart from the first refractive layer and positioned below the lower surface of the color filter layer.

In some embodiments, the refractive layer exposes a portion of the color filter layer, and the capping layer is in contact with the portion of the color filter layer exposed by the refractive layer.

In some embodiments, the color filter layer includes: a first color filter below the first substrate; a second color filter below the first color filter; and a third color filter below the second color filter.

In some embodiments, the trench is recessed from a lower surface of the third color filter to a lower surface of the first color filter to expose the first color filter.

In some embodiments, the trench is recessed from a lower surface of the third color filter to a lower surface of the second color filter to expose the second color filter.

In some embodiments, the display device further includes: a sealing member along the sealing area between the first substrate and the second substrate, wherein the sealing member includes spacer particles and couples the first substrate and the second substrate.

In some embodiments, the display device further includes: an organic layer below the capping layer.

In some embodiments, the capping layer includes: a first capping layer below the refractive layer; and a second capping layer below the first capping layer.

In some embodiments, the display device further includes: a scattering layer between the first capping layer and the second capping layer.

In a display device according to some embodiments of the present disclosure, the display device may include a first structure and a second structure coupled by a sealing member. The first structure may include a color filter layer defining a trench in a sealing area and a refractive layer disconnected by the trench. Because the color filter layer exposed by disconnection of the refractive layer is in contact with a capping layer, an area with relatively strong interlayer adhesive force may be formed. Accordingly, an inflow path of external air may be blocked, and layer lifting, dark spots, or the like may be prevented or substantially reduced (e.g., minimized).

In addition, in an area where the trench is formed, spacer particles included in the sealing member may not be in contact with the first structure. Accordingly, cracks in the capping layer, inflow of external air, or the like that may occur due to contact between the spacer particles and the first structure may be prevented or substantially reduced (e.g., minimized).

BRIEF DESCRIPTION OF THE DRAWINGS

FIG. 7 is an enlarged cross-sectional view of the area B of FIG. 6, according to some embodiments of the present disclosure.

FIG. 11 is a plan view illustrating a display device according to some other embodiments of the present disclosure.

FIG. 15 is an enlarged cross-sectional view of the area C of FIG. 14, according to some embodiments of the present disclosure.

DETAILED DESCRIPTION

Figure 1:
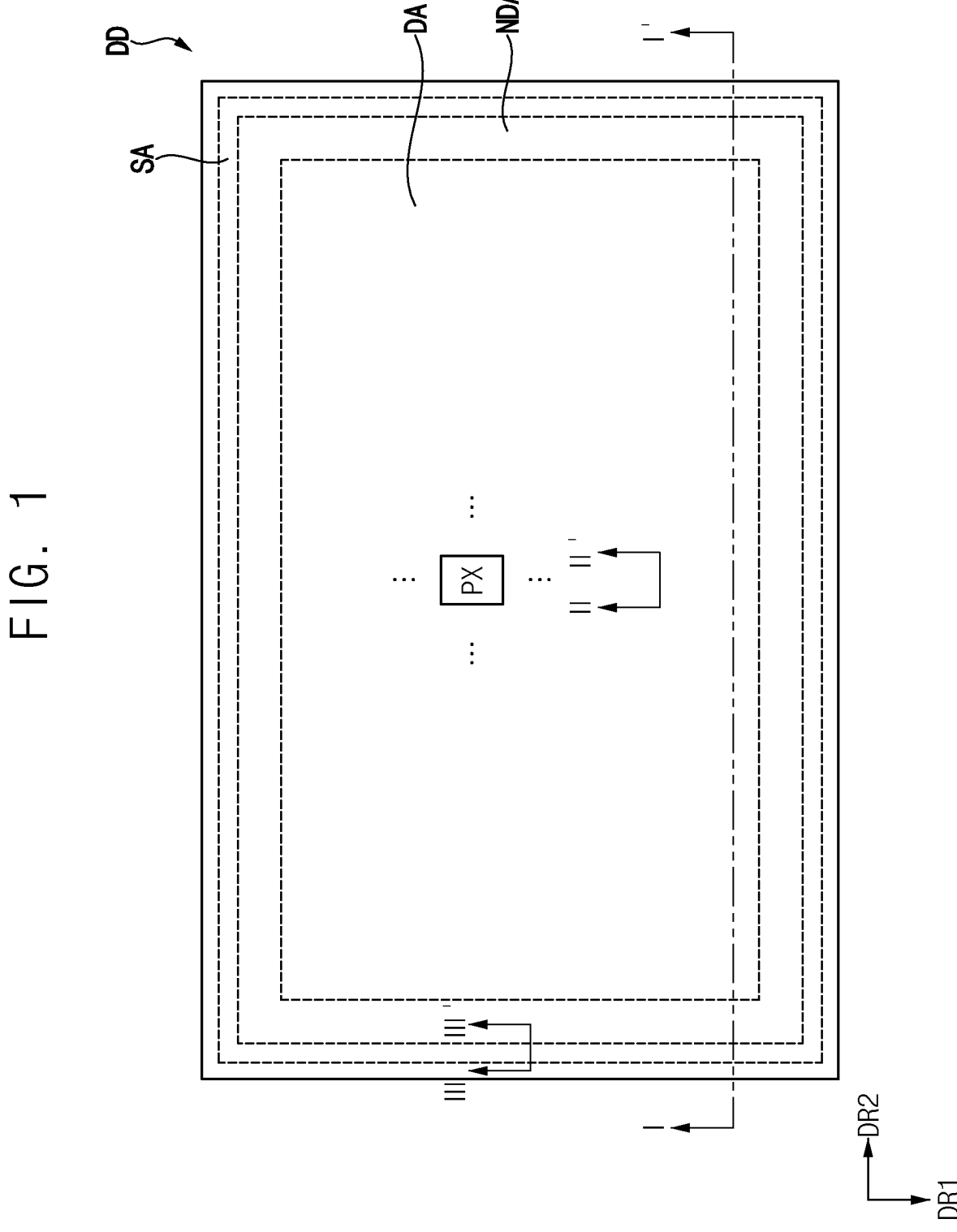
FIG. 1 is a plan view illustrating a display device according to some embodiments of the present disclosure.

Hereinafter, embodiments of the present disclosure will be described in more detail with reference to the accompanying drawings. The same reference numerals are used for the same components in the drawings, and redundant descriptions of the same components will be omitted.

FIG. 1 is a plan view illustrating a display device according to some embodiments of the present disclosure.

Referring to FIG. 1, a display device DD may include a display area DA and a non-display area NDA.

The display area DA may be an area that displays an image by generating light or adjusting a transmittance of light provided from an external light source.

A plurality of pixels PX may be disposed in the display area DA. The plurality of pixels PX may be arranged in a matrix form along a first direction DR1 and a second direction DR2 intersecting the first direction DR1. For example, the first direction DR1 may be perpendicular to the second direction DR2. Each of the plurality of pixels PX may emit light. As each of the plurality of pixels PX emits light, the display area DA may display an image.

Lines connected to the plurality of pixels PX may be further disposed in the display area DA. For example, the lines may include a data signal line, a gate signal line, a power line, or the like.

The non-display area NDA may be an area that does not display an image. The non-display area NDA may be located around the display area DA. For example, the non-display area NDA may entirely surround the display area DA.

The non-display area NDA may include a sealing area SA. The sealing area SA may be located along an edge of the non-display area NDA, and may surround the display area DA. The sealing area SA may be an area where two or more structures are coupled to each other.

Drivers that drive the plurality of pixels PX may be disposed in the non-display area NDA. For example, the drivers may include a data driver, a gate driver, a power voltage generator, a timing controller, or the like. The plurality of pixels PX may emit light based on signals transmitted from the drivers.

Figure 2:
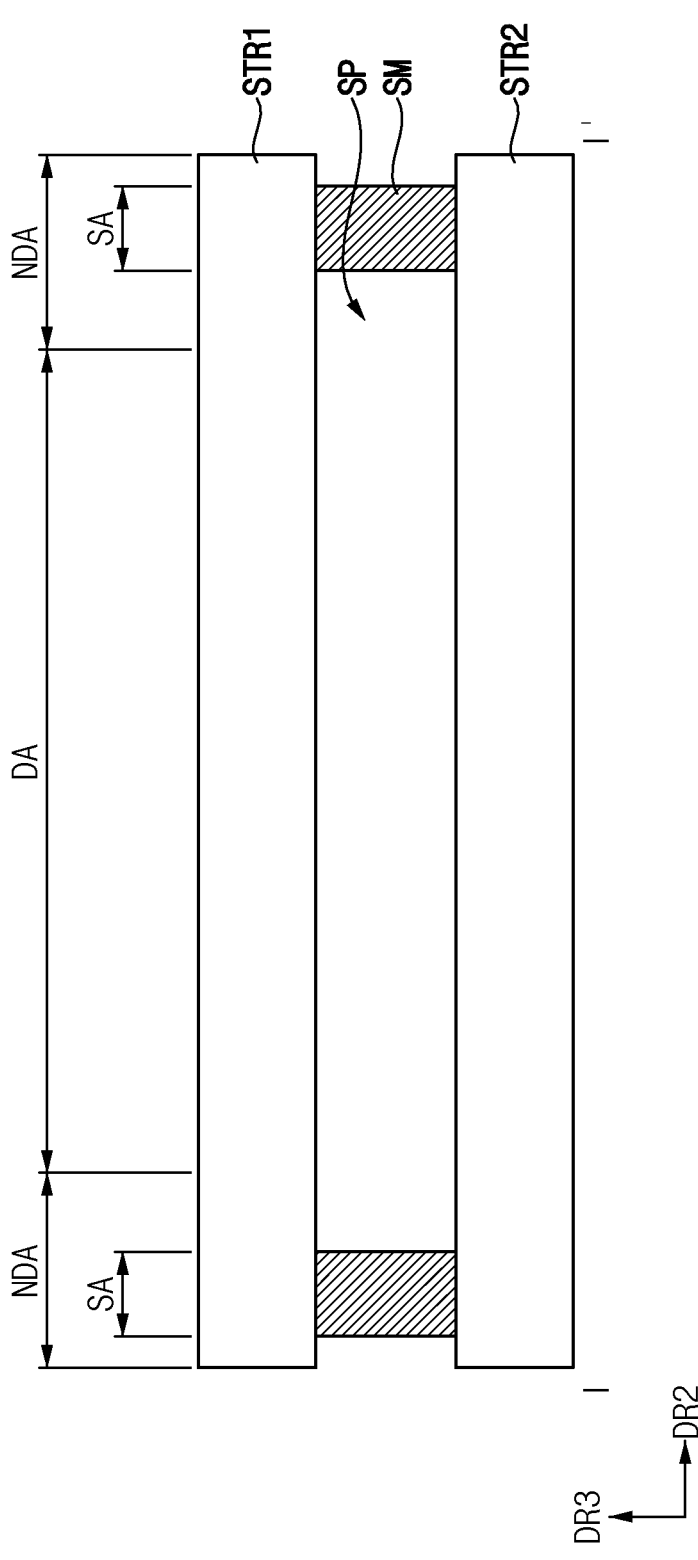
FIG. 2 is a cross-sectional view taken along the line I-I' of FIG. 1, according to some embodiments of the present disclosure.

FIG. 2 is a cross-sectional view taken along the line I-I' of FIG. 1, according to some embodiments of the present disclosure.

Referring to FIGS. 1 and 2, the display device DD may include a first structure STR1, a second structure STR2, and a sealing member SM.

The first structure STR1 may face the second structure STR2, and may be disposed on the second structure STR2. The first structure STR1 may be spaced apart from the second structure STR2 in a third direction DR3 intersecting each of the first direction DR1 and the second direction DR2. For example, the third direction DR3 may be perpendicular to each of the first direction DR1 and the second direction DR2. Accordingly, a space SP between the first structure STR1 and the second structure STR2 may be defined. The space SP may maintain a gap between the first structure STR1 and the second structure STR2. In some embodiments, the space SP is filled (e.g., completely filled) with a filler. For example, the filler may include an organic material such as silicon-based resin, epoxy-based resin, or the like, air, or the like. In addition, the filler may further include a material for refractive index matching. In some other embodiments, the space SP is in a vacuum state.

Figure 3:
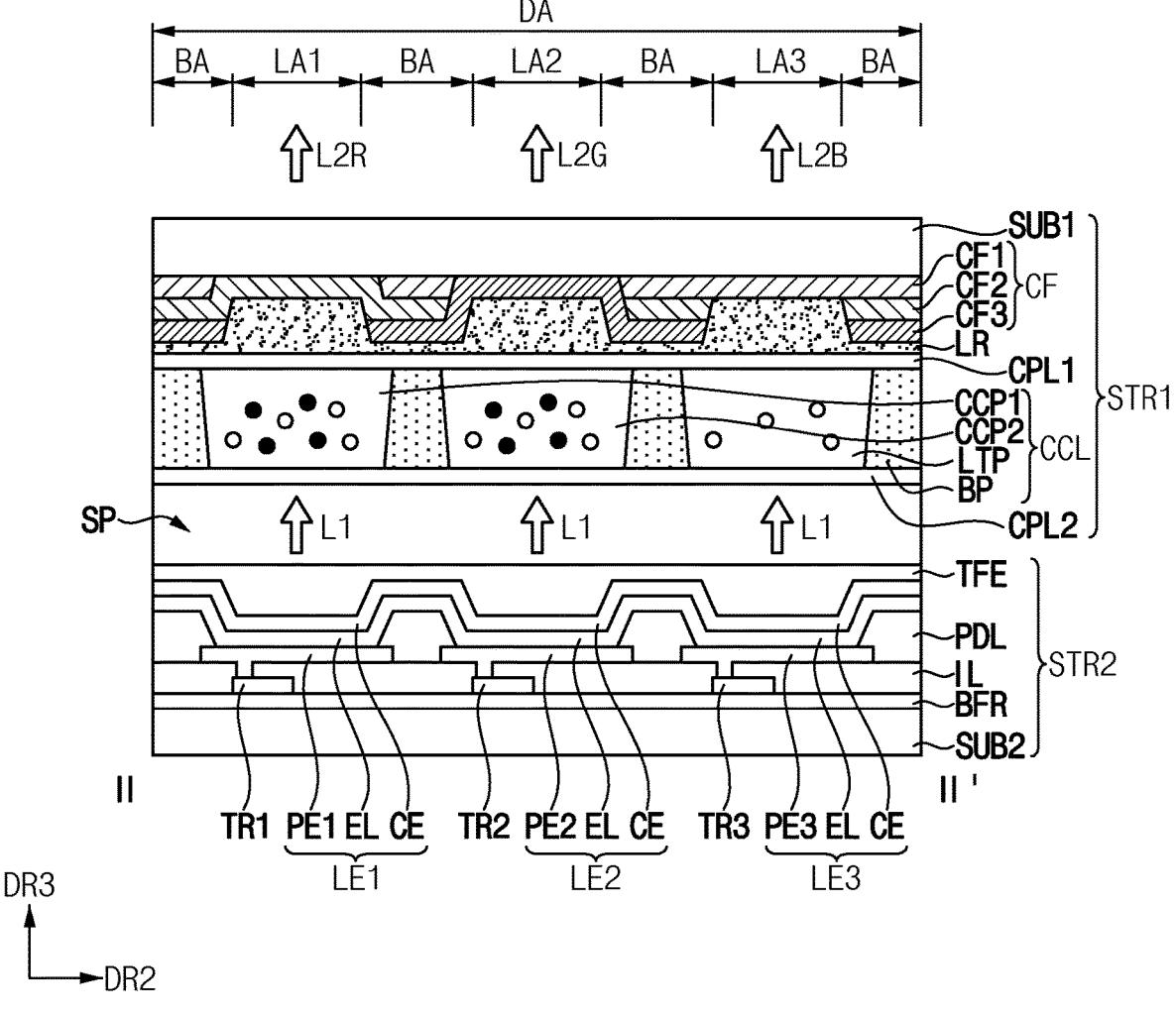
FIG. 3 is a cross-sectional view taken along the line II-II' of FIG. 1, according to some embodiments of the present disclosure.

The first structure STR1 may be a color conversion substrate including a color conversion layer (e.g., a color conversion layer CCL of FIG. 3). The color conversion layer may be disposed in the display area DA, and may convert a wavelength of light generated from a light emitting element of the second structure STR2. In addition, the first structure STR1 may further include a color filter layer (e.g., a color filter layer CF of FIG. 3) that transmits light in a specific wavelength band.

The second structure STR2 may be a display substrate including the light emitting element. The light emitting element may be disposed in the display area DA, and may generate light according to a driving signal.

The sealing member SM may be disposed between the first structure STR1 and the second structure STR2. The sealing member SM may be disposed along the sealing area SA. That is, the sealing member SM may be disposed in the sealing area SA between the first structure STR1 and the second structure STR2 to surround the display area DA in a plan view. The first structure STR1 and the second structure STR2 may be coupled by the sealing member SM.

As the space SP between the first structure STR1 and the second structure STR2 is sealed by the sealing member SM, external moisture, air, impurities, or the like may be prevented from penetrating into the space SP, or penetration thereof may be substantially reduced. In addition, the sealing member SM may maintain the space SP between the first structure STR1 and the second structure STR2. For example, the sealing member SM may include an organic material such as epoxy resin, or the like.

FIG. 3 is a cross-sectional view taken along the line II-II' of FIG. 1, according to some embodiments of the present disclosure. For example, FIG. 3 may be a cross-sectional view illustrating an example of the display area DA included in the display device DD.

Referring to FIGS. 1 and 3, the display device DD may include the first structure STR1 and the second structure STR2 in the display area DA.

The display area DA may include a light emitting area and a light blocking area BA. Light (hereinafter, incident light) L1 generated in the second structure STR2 and incident to the first structure STR1 may be emitted to outside through the light emitting area. The light emitting area may include a first light emitting area LA1, a second light emitting area LA2, and a third light emitting area LA3.

The first, second, and third light emitting areas LA1, LA2, and LA3 may emit light in different wavelength bands. For example, the first light emitting area LA1 may emit first transmitted light L2R in a red wavelength band, the second light emitting area LA2 may emit second transmitted light L2G in a green wavelength band, and the third light emitting area LA3 may emit third transmitted light L2B in a blue wavelength band, but the present disclosure is not limited thereto.

In some embodiments, the first, second, and third light emitting areas LA1, LA2, and LA3 are spaced apart from each other and repeatedly and sequentially arranged in a plan view. The light blocking area BA may be disposed between the first, second, and third light emitting areas LA1, LA2, and LA3 adjacent to each other. The light blocking area BA may surround the first, second, and third light emitting areas LA1, LA2, and LA3 in a plan view. For example, the light blocking area BA may have a grid shape in a plan view.

In some embodiments, in the display area DA, the first structure STR1 includes a first substrate SUB1, a color filter layer CF, a refractive layer LR, a first capping layer CPL1, a color conversion layer CCL, and a second capping layer CPL2.

The first substrate SUB1 may include a transparent material, a semi-transparent material, or an opaque material. For example, the first substrate SUB1 may include a rigid glass substrate, a plastic substrate, a flexible film, a metal substrate, or the like. These may be used alone or in combination with each other.

The color filter layer CF may be disposed below the first substrate SUB1. The color filter layer CF may include a first color filter CF1, a second color filter CF2, and a third color filter CF3.

The first color filter CF1 may overlap the third light emitting area LA3, the second color filter CF2 may overlap the first light emitting area LA1, and the third color filter CF3 may overlap the second light emitting area LA2. Each of the first, second, and third color filters CF1, CF2, and CF3 may selectively transmit light in a specific wavelength band.

The first color filter CF1 may transmit the third transmitted light L2B, and may block or substantially block light in a wavelength band different from that of the third transmitted light L2B. For example, the first color filter CF1 may transmit (e.g., only transmit) the third transmitted light L2B in a blue wavelength band and block or substantially block light of other wavelengths, but the present disclosure is not limited thereto. Accordingly, in the third light emitting area LA3, the third transmitted light L2B may pass through the first substrate SUB1, and may be emitted to the outside (i.e., in the third direction DR3).

The second color filter CF2 may transmit the first transmitted light L2R, and may block or substantially block light in a wavelength band different from that of the first transmitted light L2R. For example, the second color filter CF2 may transmit (e.g., only transmit) the first transmitted light L2R in a red wavelength band and block or substantially block light of other wavelengths, but the present disclosure is not limited thereto. Accordingly, in the first light emitting area LA1, the first transmitted light L2R may pass through the first substrate SUB1, and may be emitted to the outside (i.e., in the third direction DR3).

The third color filter CF3 may transmit the second transmitted light L2G, and may block or substantially block light in a wavelength band different from that of the second transmitted light L2G. For example, the third color filter CF3 may transmit (e.g., only transmit) the second transmitted light L2G in a green wavelength band and block or substantially block light of other wavelengths, but the present disclosure is not limited thereto. Accordingly, in the second light emitting area LA2, the second transmitted light L2G may pass through the first substrate SUB1, and may be emitted to the outside (i.e., in the third direction DR3).

In some embodiments, each of the first color filter CF1, the second color filter CF2, and the third color filter CF3 overlaps (e.g., overlap in a plan view) the light blocking area BA. That is, the first color filter CF1 may overlap the third light emitting area LA3 and the light blocking area BA, and may not overlap (e.g., in the plan view) the first and second light emitting areas LA1 and LA2. The second color filter CF2 may overlap (e.g., overlap in a plan view) the first light emitting area LA1 and the light blocking area BA, and may not overlap (e.g., in the plan view) the second and third light emitting areas LA2 and LA3. The third color filter CF3 may overlap (e.g., overlap in a plan view) the second light emitting area LA2 and the light blocking area BA, and may not overlap (e.g., in the plan view) the first and third light emitting areas LA1 and LA3.

In this case, in the light blocking area BA, the first, second, and third color filters CF1, CF2, and CF3 may overlap each other in the third direction DR3. That is, in the light blocking area BA, the second color filter CF2 may be disposed below the first color filter CF1, and the third color filter CF3 may be disposed below the second color filter CF2. Accordingly, color mixing between the first, second, and third light emitting areas LA1, LA2, and LA3 adjacent to each other may be prevented or substantially reduced.

The refractive layer LR may be disposed below the color filter layer CF. The refractive layer LR may have a refractive index different from that of the color conversion layer CCL. In some embodiments, the refractive layer LR has a refractive index smaller than that of the color conversion layer CCL. The refractive layer LR may increase light extraction efficiency to increase luminance and lifetime of the display device DD. For example, the refractive layer LR may include an organic material.

The first capping layer CPL1 may be disposed below the refractive layer LR. The first capping layer CPL1 may cover a lower surface of the refractive layer LR. For example, the first capping layer CPL1 may include an inorganic material.

The color conversion layer CCL may be disposed below the first capping layer CPL1. The color conversion layer CCL may include a bank pattern BP, a first color conversion pattern CCP1, a second color conversion pattern CCP2, and a transmission pattern LTP.

The bank pattern BP may overlap the light blocking area BA. For example, the bank pattern BP may entirely overlap the light blocking area BA, and may have a grid shape in a plan view. The bank pattern BP may define a plurality of openings overlapping the first, second, and third light emitting areas LA1, LA2, and LA3. The bank pattern BP may define a space in which ink may be accommodated in a process of forming the color conversion layer CCL. In addition, the bank pattern BP may block light emitted from the second structure STR2. In some embodiments, the bank pattern BP includes a light blocking material. For example, at least a portion of the bank pattern BP may include a light blocking material such as black pigment, dye, carbon black, or the like.

The first and second color conversion patterns CCP1 and CCP2 and the transmission pattern LTP may be disposed in the openings defined by the bank pattern BP. The first color conversion pattern CCP1 may be disposed in the opening overlapping the first light emitting area LA1, the second color conversion pattern CCP2 may be disposed in the opening overlapping the second light emitting area LA2, and the transmission pattern LTP may be disposed in the opening overlapping the third light emitting area LA3.

Each of the first and second color conversion patterns CCP1 and CCP2 may convert the incident light L1 into light in a specific wavelength band.

In some embodiments, the first color conversion pattern CCP1 converts the incident light L1 so as to emit the first transmitted light L2R. The first color conversion pattern CCP1 may include first quantum dots that are excited by the incident light L1 to emit the first transmitted light L2R. In addition, the first color conversion pattern CCP1 may further include first scattering particles and a first photosensitive polymer in which the first scattering particles are dispersed. For example, as the incident light L1 passes through the first color conversion pattern CCP1, the first transmitted light L2R in a red wavelength band may be emitted from the first light emitting area LA1, but the present disclosure is not limited thereto.

In some embodiments, the second color conversion pattern CCP2 converts the incident light L1 so as to emit the second transmitted light L2G. The second color conversion pattern CCP2 may include second quantum dots that are excited by the incident light L1 to emit the second transmitted light L2G. In addition, the second color conversion pattern CCP may further include second scattering particles and a second photosensitive polymer in which the second scattering particles are dispersed. For example, as the incident light L1 passes through the second color conversion pattern CCP2, the second transmitted light L2G in a green wavelength band may be emitted from the second light emitting area LA2, but the present disclosure is not limited thereto.

In some embodiments, the transmission pattern LTP transmits the incident light L1 to emit the third transmitted light L2B. The transmission pattern LTP may include third scattering particles and a third photosensitive polymer in which the third scattering particles are dispersed. For example, as the incident light L1 passes through the transmission pattern LTP, the third transmitted light L2B in a blue wavelength band may be emitted from the third light emitting area LA3, but the present disclosure is not limited thereto.

The first, second, and third scattering particles may scatter and emit the incident light L1. The first, second, and third scattering particles may include the same material. Each of the first, second, and third photosensitive polymers may include an organic material having light transmittance such as silicone resin, epoxy resin, or the like.

The second capping layer CPL2 may be disposed below the color conversion layer CCL. The second capping layer CPL2 may cover a lower surface of the color conversion layer CCL. For example, the second capping layer CPL2 may include an inorganic material.

In some embodiments, in the display area DA, the second structure STR2 includes a second substrate SUB2, a buffer layer BFR, first, second, and third transistors TR1, TR2, and TR3, an insulating layer IL, a pixel defining layer PDL, first, second, and third light emitting elements LE1, LE2, and LE3, and an encapsulation layer TFE. The second structure STR2 may be disposed below the first structure STR1 with the space SP interposed therebetween.

Here, the first light emitting element LE1 may include a first pixel electrode PE1, a light emitting layer EL, and a common electrode CE, the second light emitting element LE2 may include a second pixel electrode PE2, the light emitting layer EL, and the common electrode CE, and the third light emitting element LE3 may include a third pixel electrode PE3, the light emitting layer EL, and the common electrode CE.

The second substrate SUB2 may include a transparent material or an opaque material. For example, the second substrate SUB2 may include a rigid glass substrate, a plastic substrate, a flexible film, a metal substrate, or the like. These may be used alone or in combination with each other.

The buffer layer BFR may be disposed on the second substrate SUB2. The buffer layer BFR may prevent metal atoms or impurities from being diffused from the second substrate SUB2 to the first, second, and third transistors TR1, TR2, and TR3, or substantially reduce instances thereof. In addition, the buffer layer BFR may improve (e.g., increased) a flatness of a surface of the second substrate SUB2 when the surface of the second substrate SUB2 is not uniform. The buffer layer BFR may include an inorganic material such as silicon oxide ($SiO_x$), silicon nitride ($SiN_x$), silicon carbide ($SiC_x$), silicon oxynitride ($SiO_xN_y$), silicon oxynitride ($SiO_xC_y$), or the like. These may be used alone or in combination with each other.

The first, second, and third transistors TR1, TR2, and TR3 may be disposed on the buffer layer BFR. Each of channel layers of the first, second, and third transistors TR1, TR2, and TR3 may include a silicon semiconductor material or an oxide semiconductor material. Examples of the silicon semiconductor material may include amorphous silicon, polycrystalline silicon, or the like. Examples of the oxide semiconductor material may include indium gallium zinc oxide (IGZO), indium tin zinc oxide (ITZO), or the like. These may be used alone or in combination with each other.

The insulating layer IL may be disposed on the buffer layer BFR, and may cover the first, second, and third transistors TR1, TR2, and TR3. The insulating layer IL may include an inorganic material such as silicon oxide, silicon nitride, silicon carbide, silicon oxynitride, silicon oxynitride, silicon oxynitride, or the like. In addition, the insulating layer IL may include organic materials such as phenol resin, acrylic resin, polyimide resin, polyamide resin, siloxane resin, epoxy resin, or the like. These may be used alone or in combination with each other.

The first, second, and third pixel electrodes PE1, PE2, and PE3 may be disposed on the insulating layer IL. The first, second, and third pixel electrodes PE1, PE2, and PE3 may overlap the first, second, and third light emitting areas LA1, LA2, and LA3, respectively. The first, second, and third pixel electrodes PE1, PE2, and PE3 may be connected to the first, second, and third transistors TR1, TR2, and TR3 through contact holes formed in the insulating layer IL, respectively. Each of the first, second, and third pixel electrodes PE1, PE2, and PE3 may include metal, alloy, metal nitride, conductive metal oxide, transparent conductive material, or the like. These may be used alone or in combination with each other.

The pixel defining layer PDL may be disposed on the insulating layer IL, and may cover at least a portion of each of the first, second, and third pixel electrodes PE1, PE2 and PE3. That is, the pixel defining layer PDL may define an opening exposing at least a portion of an upper surface of each of the first, second, and third pixel electrodes PE1, PE2, and PE3. The pixel defining layer PDL may include an organic material such as epoxy resin, siloxane resin, or the like.

The light emitting layer EL may be disposed on the first, second, and third pixel electrodes PE1, PE2, and PE3 exposed by the pixel defining layer PDL and the pixel defining layer PDL. In some embodiments, the light emitting layer EL continuously extends in the display area DA across the plurality of pixels. In some other embodiments, the light emitting layer EL is separated from a light emitting layer of adjacent pixels.

The light emitting layer EL may include at least one of an organic material and a quantum dot that emit light of a preset color. For example, the light emitting layer EL may emit light in a blue wavelength band, but the present disclosure is not limited thereto.

The light emitting layer EL may have a multilayer structure. Functional layers such as a hole injection layer, a hole transport layer, an electron transport layer, an electron injection layer, or the like may be disposed on or below the light emitting layer EL.

In some embodiments, the light emitting layer EL has a structure in which a plurality of blue organic light emitting layers are stacked. For example, the light emitting layer EL may have a structure in which three blue organic light emitting layers are stacked. However, the present disclosure is not limited thereto. In some other embodiments, the light emitting layer EL has a structure in which multiple blue organic light emitting layers and an organic light emitting layer that emits light in different wavelength bands are stacked. For example, the light emitting layer EL may have a structure in which three blue organic light emitting layers and one green organic light emitting layer are stacked.

The common electrode CE may be disposed on the light emitting layer EL. The common electrode CE may continuously extend in the display area DA across the plurality of pixels. The common electrode CE may include a metal, a metal alloy, a metal nitride, a conductive metal oxide, a transparent conductive material, or the like. These may be used alone or in combination with each other.

Accordingly, the first light emitting element LE1 including the first pixel electrode PE1, the light emitting layer EL, and the common electrode CE, the second light emitting element LE2 including the second pixel electrode PE2, the light emitting layer EL, and the common electrode CE, and the third light emitting element LE3 including the third pixel electrode PE3, the light emitting layer EL, and the common electrode CE may be disposed on the second substrate SUB2.

The encapsulation layer TFE may be disposed on the common electrode CE. The encapsulation layer TFE may protect the first, second, and third light emitting elements LE1, LE2, and LE3 from external oxygen and moisture. The encapsulation layer TFE may include at least one inorganic layer and at least one organic layer.

Figure 4:
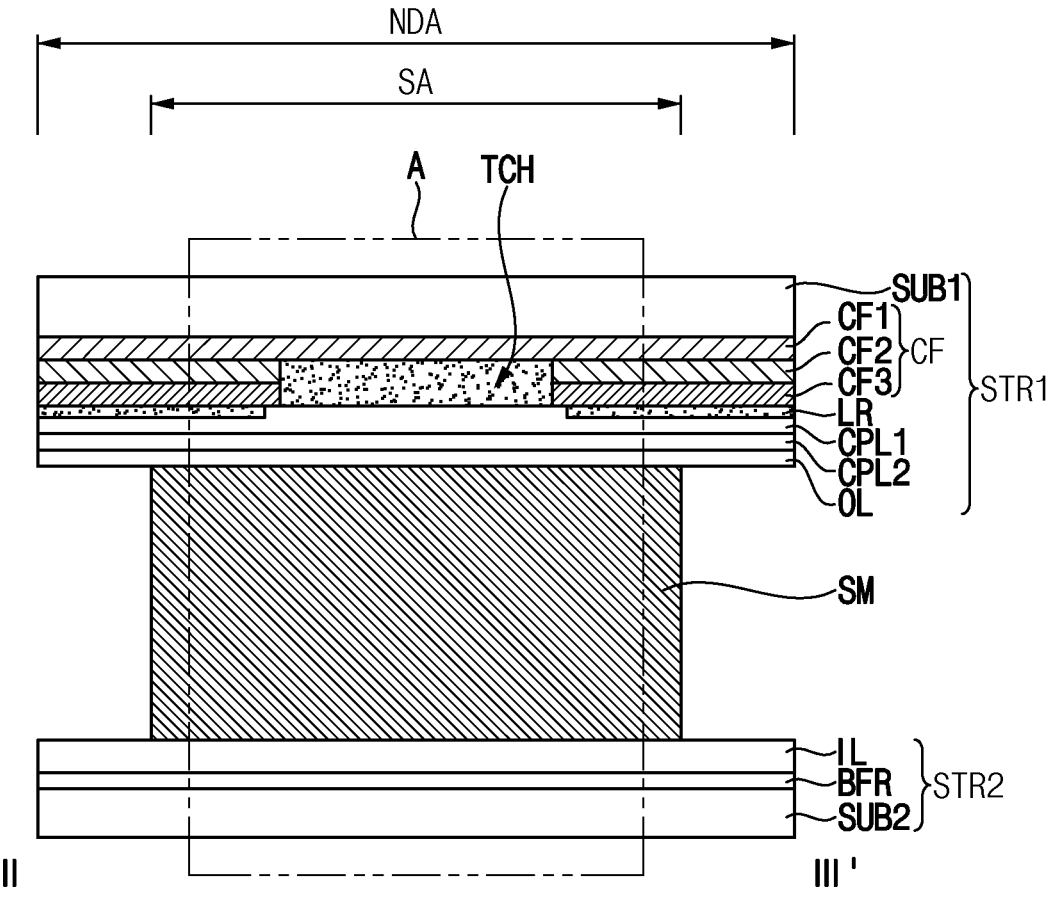
FIG. 4 is an example of a cross-sectional view taken along the line III-III' of FIG. 1, according to some embodiments of the present disclosure.
Figure 4:
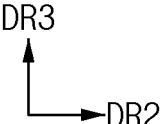
Figure 5:
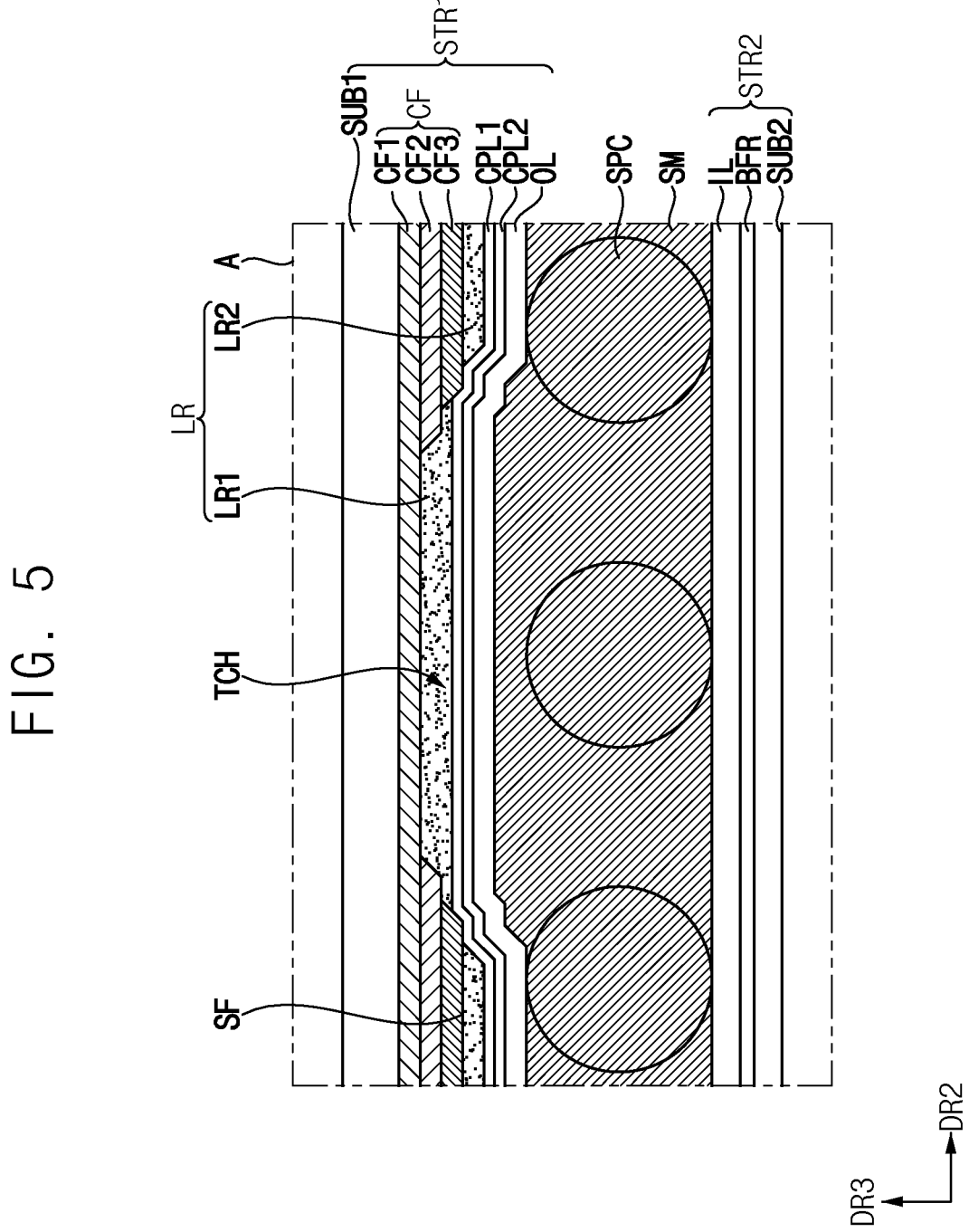
FIG. 5 is an enlarged cross-sectional view of the area A of FIG. 4, according to some embodiments of the present disclosure.

FIG. 4 is an example of a cross-sectional view taken along the line III-III' of FIG. 1, according to some embodiments of the present disclosure. FIG. 5 is an enlarged cross-sectional view of the area A of FIG. 4, according to some embodiments of the present disclosure. For example, FIGS. 4 and 5 may be cross-sectional views illustrating an example of the sealing area SA included in the display device DD.

Hereinafter, descriptions overlapping the display device DD described with reference to FIG. 3 will be omitted or simplified.

Referring to FIGS. 1, 4, and 5, the display device DD may include the first structure STR1, the second structure STR2, and the sealing member SM in the sealing area SA.

In some embodiments, in the sealing area SA, the first structure STR1 includes the first substrate SUB1, the color filter layer CF, the refractive layer LR, the first capping layer CPL1, the second capping layer CPL2, and an organic layer OL.

The color filter layer CF may be disposed below the first substrate SUB1. The color filter layer CF may include the first color filter CF1, the second color filter CF2, and the third color filter CF3. The first color filter CF1 may be disposed below the first substrate SUB1, the second color filter CF2 may be disposed below the first color filter CF1, and the third color filter CF3 may be disposed below the second color filter CF2.

In some embodiments, in the sealing area SA, the color filter layer CF defines a trench TCH recessed from a lower surface SF of the color filter layer CF in a direction (i.e., the third direction DR3) toward the first substrate SUB1.

In some embodiments, the trench TCH exposes the first color filter CF1. That is, the trench TCH may be recessed from a lower surface of the third color filter CF3 to a lower surface of the first color filter CF1 to expose the first color filter CF1.

The refractive layer LR may be disposed below the color filter layer CF. In some embodiments, the refractive layer LR is disconnected by the trench TCH. Accordingly, the refractive layer LR may expose a portion of the color filter layer CF. For example, the refractive layer LR may expose a portion of the third color filter CF3 at an edge of the trench TCH.

In other words, the refractive layer LR may include a first refractive layer LR1 and a second refractive layer LR2 spaced apart from each other. The first refractive layer LR1 may be disposed in the trench TCH of the color filter layer CF, and the second refractive layer LR2 may be disposed below the lower surface SF of the color filter layer CF. That is, the first refractive layer LR1 may be in contact with the lower surface of the first color filter CF1, and the second refractive layer LR2 may be in contact with the lower surface of the third color filter CF3.

The first capping layer CPL1 may be disposed below the refractive layer LR. At least a portion of the first capping layer CPL1 may be in contact with the color filter layer CF. For example, as the refractive layer LR exposes the portion of the color filter layer CF, the first capping layer CPL1 may be in contact with the portion of the color filter layer CF exposed by the refractive layer LR. In this case, an adhesive force between the first capping layer CPL1 and the color filter layer CF may be stronger than an adhesive force between the first capping layer CPL1 and the refractive layer LR. Accordingly, an area with enhanced interlayer adhesive force may be formed in the area where the first refractive layer LR1 and the second refractive layer LR2 are spaced apart from each other.

Because the adhesive force between the first capping layer CPL1 and the refractive layer LR is relatively weak, layer separation between the first capping layer CPL1 and the refractive layer LR may occur. When layer separation occurs between the first capping layer CPL1 and the refractive layer LR in an edge area of the first structure STR1, external air, moisture, or the like may flow in from the outside of the display device DD through the separated point.

In this case, in the present disclosure, because the refractive layer LR is not continuously extended but is disconnected in the sealing area SA, and the first capping layer CPL1 and the color filter layer CF are in contact with each other to form the area with relatively strong interlayer adhesive force, an inflow path of the external air may be blocked. Therefore, layer lifting, dark spots, or the like that may occur due to the weak adhesive force between the first capping layer CPL1 and the refractive layer LR may be prevented or substantially reduced (e.g., minimized).

The second capping layer CPL2 may be disposed below the first capping layer CPL1. The organic layer OL may be disposed below the second capping layer CPL2. The organic layer OL may include an organic material. For example, the organic layer OL may include a polymer resin and a pigment or dye dispersed in the polymer resin.

The organic layer OL may protect the first capping layer CPL1 and the second capping layer CPL2 from an external impact. The organic layer OL may substantially reduce (e.g., minimize) deformation of the first structure STR1 and the second structure STR2 due to an external impact while coupling the first structure STR1 and the second structure STR2, and may maintain the gap between the first structure STR1 and the second structure STR2. Therefore, layer separation, cracks, or the like that occur in the edge area of the first structure STR1 may be prevented or substantially reduced.

In some embodiments, in the sealing area SA, the second structure STR2 includes the second substrate SUB2, the buffer layer BFR, and the insulating layer IL. The buffer layer BFR and the insulating layer IL may be sequentially disposed on the second substrate SUB2.

In the sealing area SA, the sealing member SM may be disposed between the first structure STR1 and the second structure STR2. The sealing member SM may be in contact with the first structure STR1 and the second structure STR2. In addition, the sealing member SM may couple the first structure STR1 and the second structure STR2.

In some embodiments, the sealing member SM includes spacer particles SPC. For example, the spacer particles SPC may include an inorganic material such as silicon oxide, silicon nitride, or the like. The spacer particles SPC may have various suitable sizes depending on the gap between the first structure STR1 and the second structure STR2 in the sealing area SA. For example, a length of the spacer particles SPC in the third direction DR3 may be about 1 mm to about tens of mm, but the present disclosure is not limited thereto.

The spacer particles SPC may be in contact with the first structure STR1 and the second structure STR2. In this case, the spacer particles SPC may not be in contact with the first structure STR1 in an area where the trench TCH is formed. That is, the spacer particles SPC may not be in contact with a lower surface of the organic layer OL in the area where the trench TCH is formed, but may be in contact with the lower surface of the organic layer OL in an area where the trench TCH is not formed.

The spacer particles SPC may cause deformation of the second structure STR2 while coupling the first structure STR1 and the second structure STR2. For example, the spacer particles SPC may generate a crack by applying an impact to the first capping layer CPL1 or the second capping layer CPL2 while coupling the first structure STR1 and the second structure STR2. If a crack occurs in the first capping layer CPL1 or the second capping layer CPL2 in the sealing area SA, external air may flow in from the outside of the display device DD through a point where the crack occurred.

In this case, in the present disclosure, because the refractive layer LR is disconnected in the sealing area SA, and the first capping layer CPL1 and the color filter layer CF are in contact with each other to form the area where interlayer adhesive force is relatively strong, an inflow path of external air may be blocked. In addition, because the spacer particles SPC are not in contact with the first structure STR1 in the area where the trench TCH is formed, cracks may not occur. Therefore, inflow of external air, cracks, or the like that may occur due to contact between the spacer particles SPC and the first structure STR1 may be prevented or substantially reduced (e.g., minimized).

Figure 6:
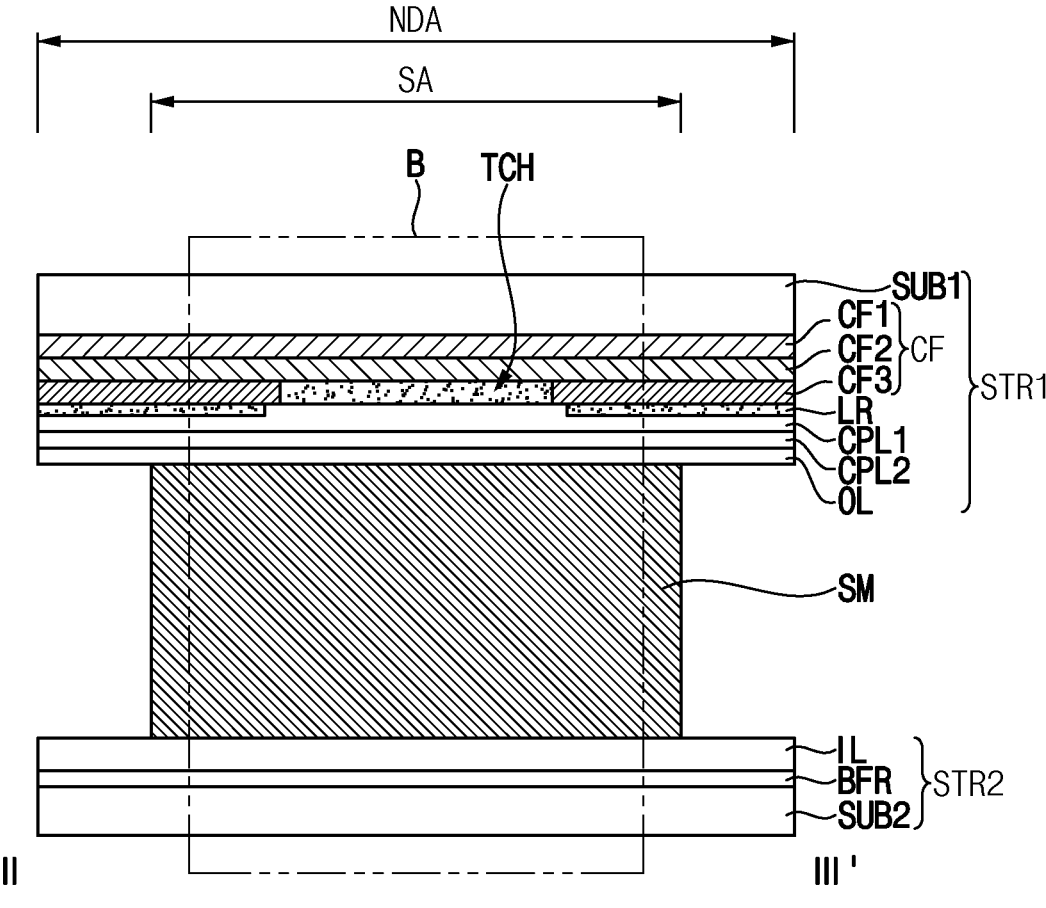
FIG. 6 is another example of a cross-sectional view taken along the line III-III' of FIG. 1, according to some embodiments of the present disclosure.
Figure 6:
Figure 7:
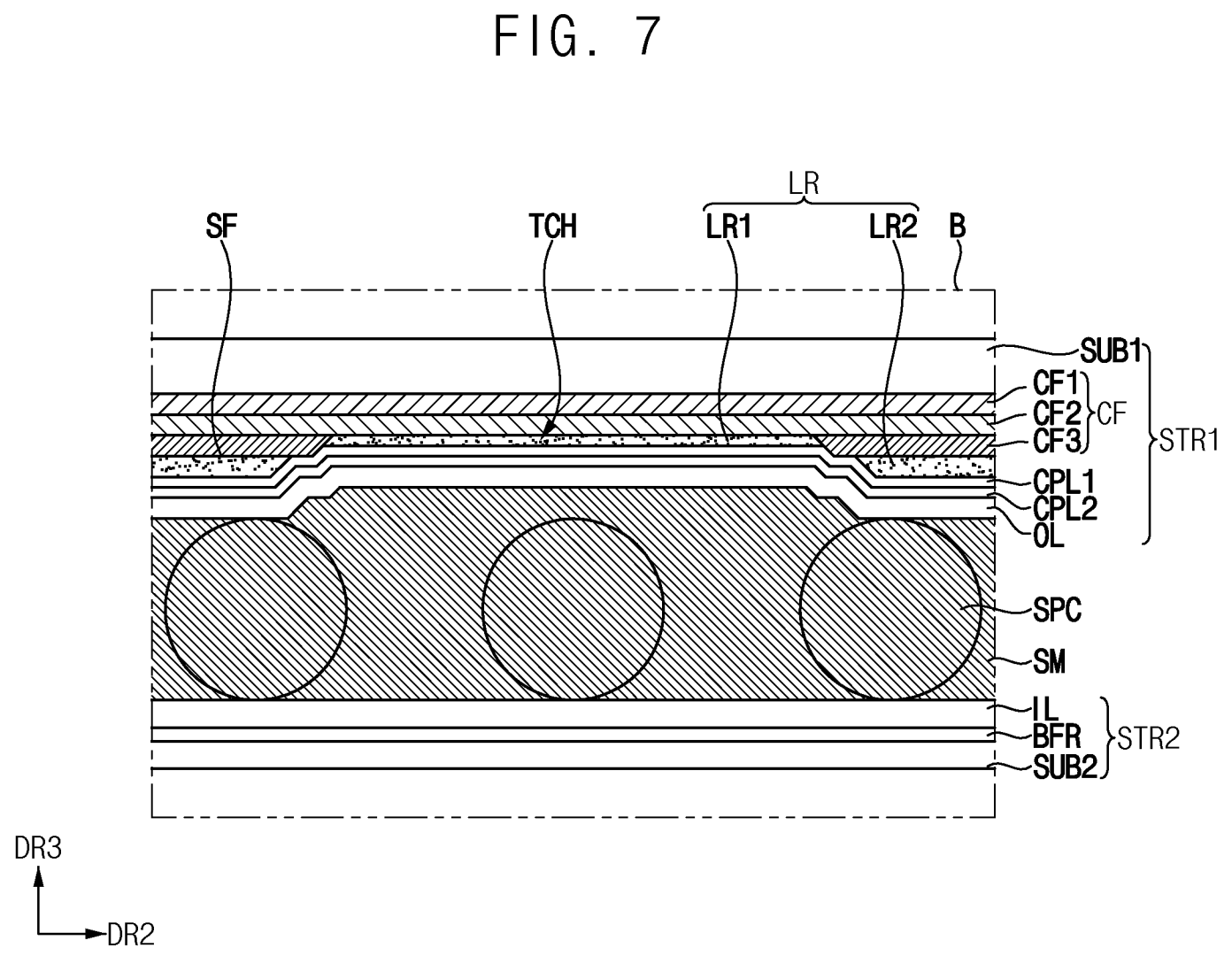

FIG. 6 is another example of a cross-sectional view taken along the line III-III' of FIG. 1, according to some embodiments of the present disclosure. FIG. 7 is an enlarged cross-sectional view of the area B of FIG. 6, according to some embodiments of the present disclosure.

For example, FIGS. 6 and 7 may be cross-sectional views illustrating another example of the sealing area SA included in the display device DD. The display device DD described with reference to FIGS. 6 and 7 may be substantially the same as or similar to the display device DD described with reference to FIGS. 4 and 5, except for a shape of the trench TCH.

Referring to FIGS. 1, 6, and 7, the display device DD may include the first structure STR1, the second structure STR2, and the sealing member SM in the sealing area SA.

In some embodiments, in the sealing area SA, the first structure STR1 includes the first substrate SUB1, the color filter layer CF, the refractive layer LR, the first capping layer CPL1, the second capping layer CPL2, and the organic layer OL.

In some embodiments, in the sealing area SA, the color filter layer CF defines a trench TCH recessed from the lower surface SF of the color filter layer CF in the direction (i.e., the third direction DR3) toward the first substrate SUB1.

In some embodiments, the trench TCH exposes the second color filter CF2. That is, the trench TCH may be recessed from the lower surface of the third color filter CF3 to a lower surface of the second color filter CF2 to expose the second color filter CF2.

The refractive layer LR may be disposed below the color filter layer CF, and may be disconnected by the trench TCH. Accordingly, the refractive layer LR may expose a portion of the color filter layer CF at an edge of the trench TCH.

The refractive layer LR may include the first refractive layer LR1 disposed in the trench TCH of the color filter layer CF and the second refractive layer LR2 spaced apart from the first refractive layer LR1 and disposed below the lower surface SF of the color filter layer CF. That is, the first refractive layer LR1 may be in contact with the lower surface of the second color filter CF2, and the second refractive layer LR2 may be in contact with the lower surface of the third color filter CF3.

Figure 8:
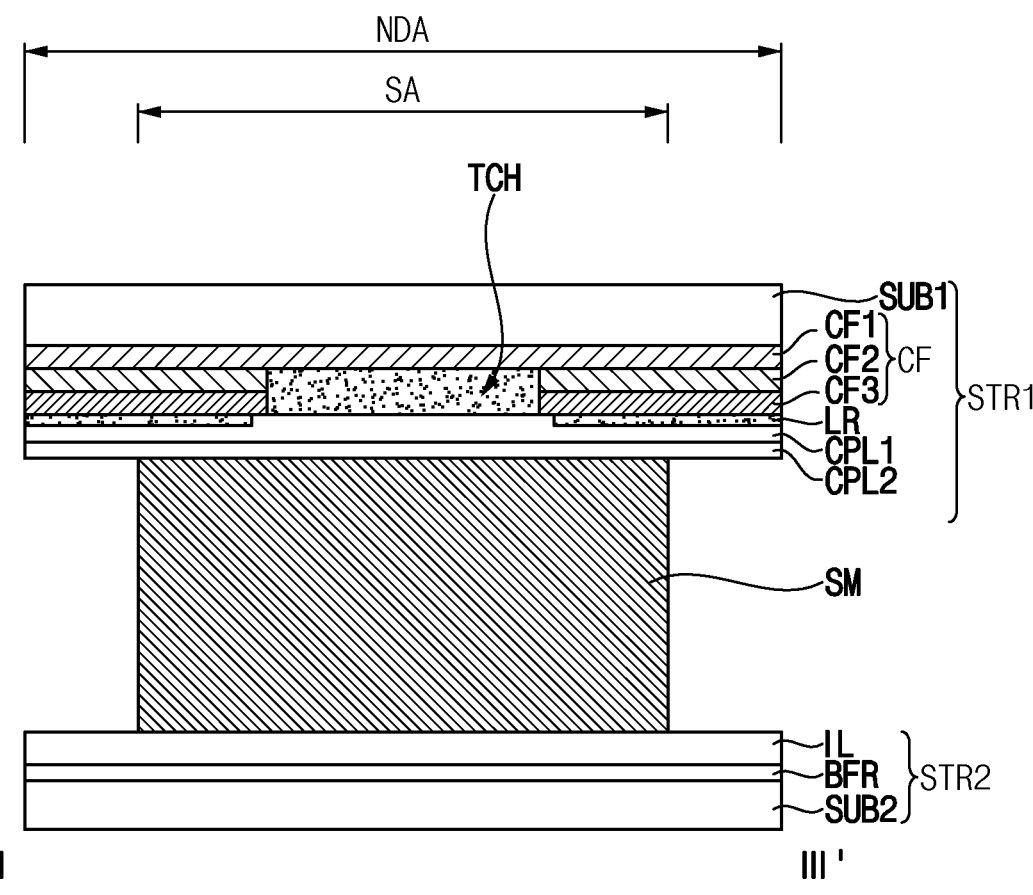
FIG. 8 is still another example of a cross-sectional view taken along the line III-III' of FIG. 1, according to some embodiments of the present disclosure.
Figure 8:

FIG. 8 is still another example of a cross-sectional view taken along the line III-III' of FIG. 1, according to some embodiments of the present disclosure. For example, FIG. 8 may be a cross-sectional view illustrating still another example of the sealing area SA included in the display device DD.

The display device DD described with reference to FIG. 8 may be substantially the same as or similar to the display device DD described with reference to FIGS. 4 and 5, except for the organic layer OL.

Referring to FIGS. 1, 2, and 8, the display device DD may include the first structure STR1, the second structure STR2, and the sealing member SM in the sealing area SA.

In some embodiments, in the sealing area SA, the first structure STR1 includes the first substrate SUB1, the color filter layer CF, the refractive layer LR, the first capping layer CPL1, and the second capping layer CPL2.

The color filter layer CF, the refractive layer LR, the first capping layer CPL1, and the second capping layer CPL2 may be sequentially disposed below the first substrate SUB1. In some embodiments, the sealing member SM is in contact with the second capping layer CPL2.

Figure 9:
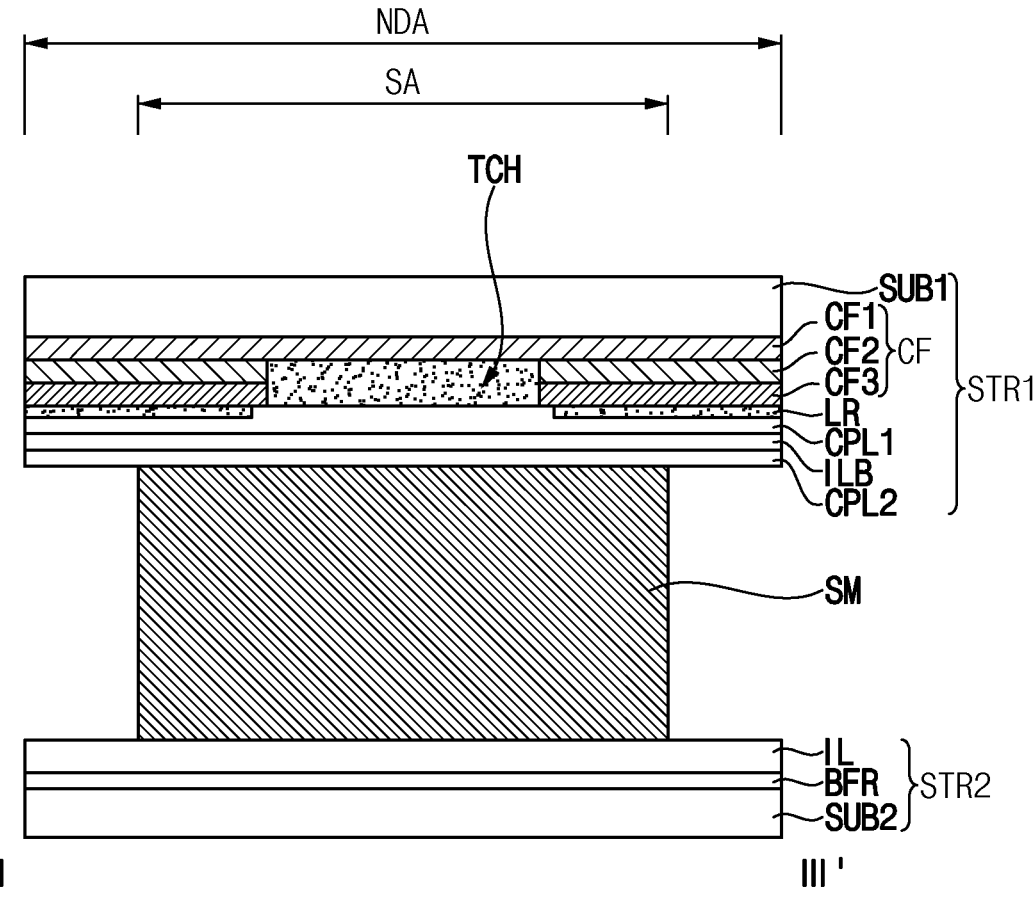
FIG. 9 is still another example of a cross-sectional view taken along the line III-III' of FIG. 1, according to some embodiments of the present disclosure.
Figure 9:

FIG. 9 is still another example of a cross-sectional view taken along the line III-III' of FIG. 1, according to some embodiments of the present disclosure. For example, FIG. 9 may be a cross-sectional view illustrating still another example of the sealing area SA included in the display device DD.

The display device DD described with reference to FIG. 9 may be substantially the same as or similar to the display device DD described with reference to FIG. 8, except for a scattering layer ILB.

Referring to FIGS. 1 and 9, the display device DD may include the first structure STR1, the second structure STR2, and the sealing member SM in the sealing area SA.

In some embodiments, in the sealing area SA, the first structure STR1 includes the first substrate SUB1, the color filter layer CF, the refractive layer LR, the first capping layer CPL1, the scattering layer ILB, and the second capping layer CPL2.

The color filter layer CF, the refractive layer LR, the first capping layer CPL1, and the second capping layer CPL2 may be sequentially disposed below the first substrate SUB1. In some embodiments, the scattering layer ILB is disposed between the first capping layer CPL1 and the second capping layer CPL2.

The scattering layer ILB may include scattering particles dispersed in a polymer. The scattering layer ILB may scatter and emit light. In addition, the scattering layer ILB may protect the first capping layer CPL1 or the second capping layer CPL2.

Figure 10:
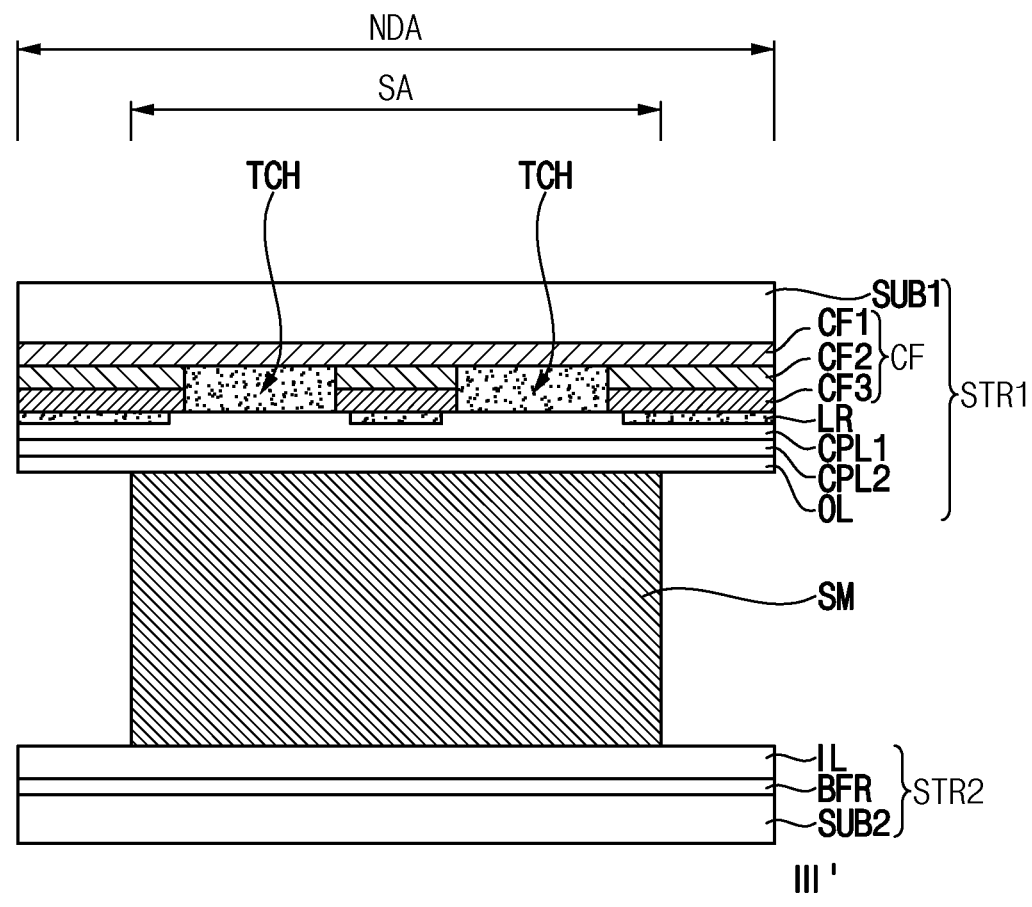
FIG. 10 is still another example of a cross-sectional view taken along the line III-III' of FIG. 1, according to some embodiments of the present disclosure.
Figure 10:

FIG. 10 is still another example of a cross-sectional view taken along the line III-III' of FIG. 1, according to some embodiments of the present disclosure. For example, FIG. 10 may be a cross-sectional view illustrating still another example of the sealing area SA included in the display device DD.

The display device DD described with reference to FIG. 10 may be substantially the same as or similar to the display device DD described with reference to FIGS. 4 and 5, except for a number of trenches TCH.

Referring to FIGS. 1 and 10, the display device DD may include the first structure STR1, the second structure STR2, and the sealing member SM in the sealing area SA.

In some embodiments, in the sealing area SA, the first structure STR1 includes the first substrate SUB1, the color filter layer CF, the refractive layer LR, the first capping layer CPL1, the second capping layer CPL2, and the organic layer OL.

In the sealing area SA, the color filter layer CF may define the trench TCH recessed from the lower surface of the color filter layer CF in the direction (i.e., the third direction DR3) toward the first substrate SUB1. In some embodiments, the color filter layer CF defines a plurality of trenches TCH exposing the first color filter CF1 or the second color filter CF2 in the sealing area SA.

In FIG. 10, the color filter layer CF is illustrated as defining two trenches TCH, but the present disclosure is not limited thereto. For another example, the color filter layer CF may define three or more trenches TCH.

The display device DD according to some embodiments of the present disclosure includes the color filter layer CF defining the trench TCH in the sealing area SA and the refractive layer LR disconnected by the trench TCH. Because the color filter layer CF exposed by the refractive layer LR is in contact with the first capping layer CPL1, the area with relatively strong interlayer adhesive force may be formed. Accordingly, the inflow path of external air is blocked, and layer lifting, dark spots, or the like may be prevented or substantially reduced (e.g., minimized). In addition, because the spacer particles SPC included in the sealing member SM are not in contact with the first structure STR1 in the area where the trench TCH is formed, cracks, inflow of external air that may occur due to contact between the spacer particles SPC and the first structure STR1 may be prevented or substantially reduced (e.g., minimized).

Figure 11:
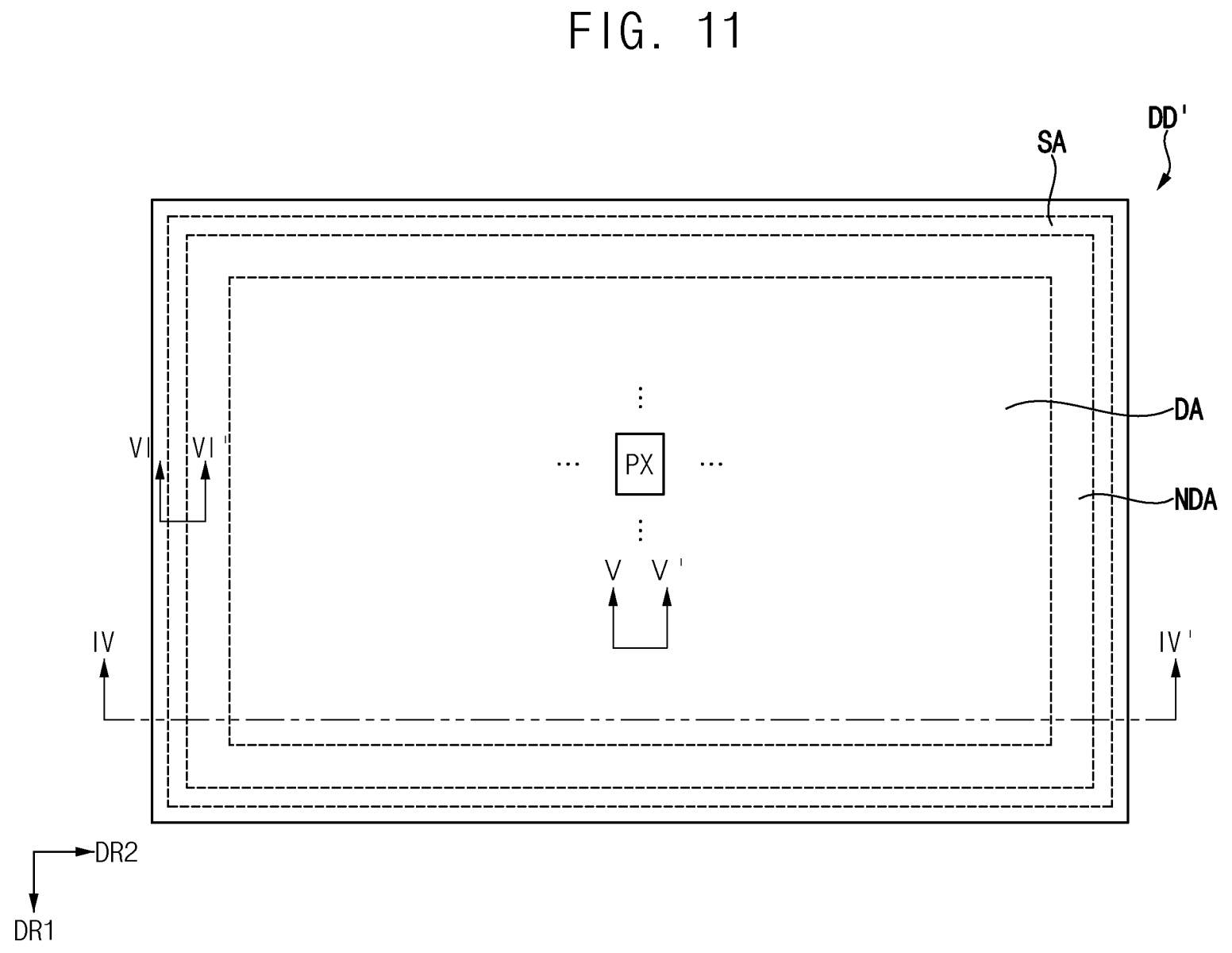
Figure 12:
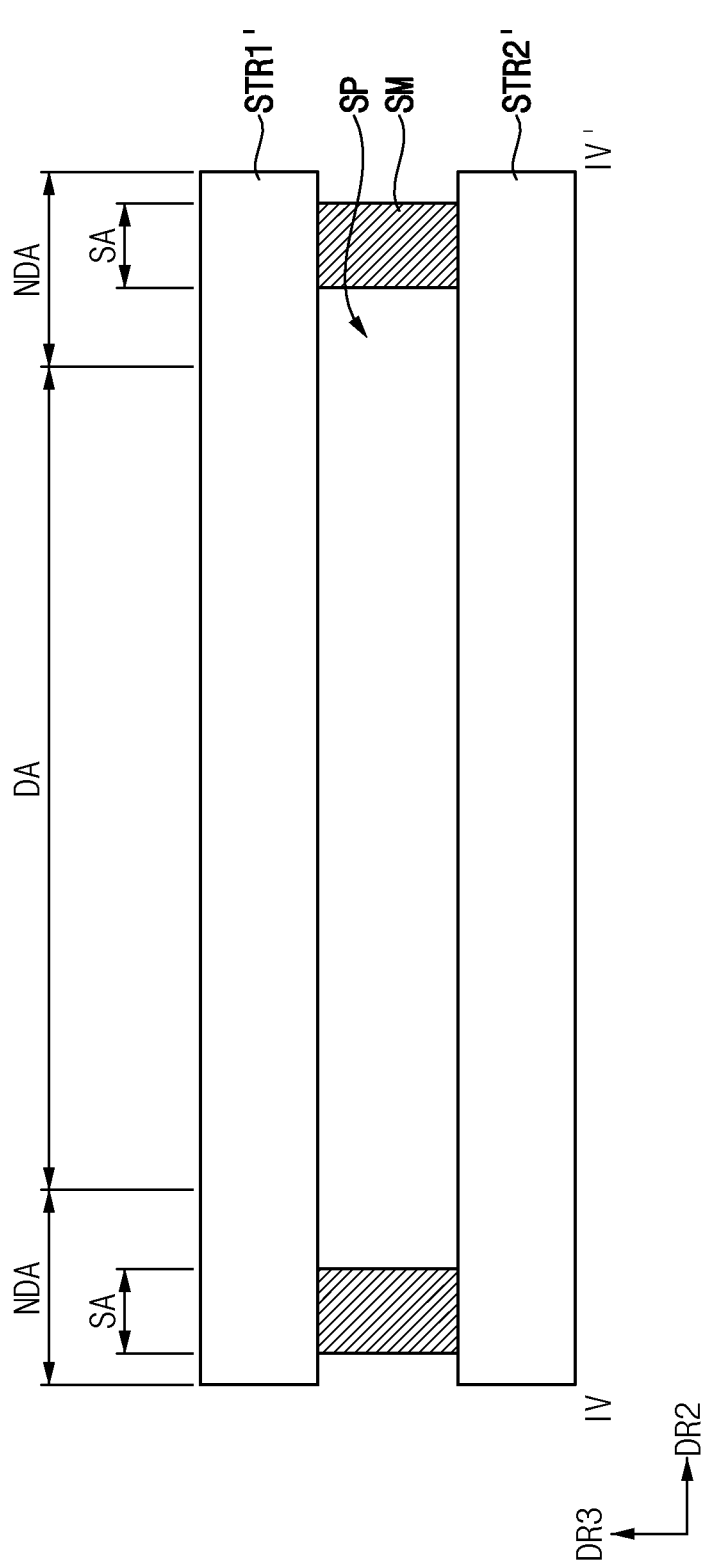
FIG. 12 is a cross-sectional view taken along the line IV-IV' of FIG. 11, according to some embodiments of the present disclosure.
Figure 13:
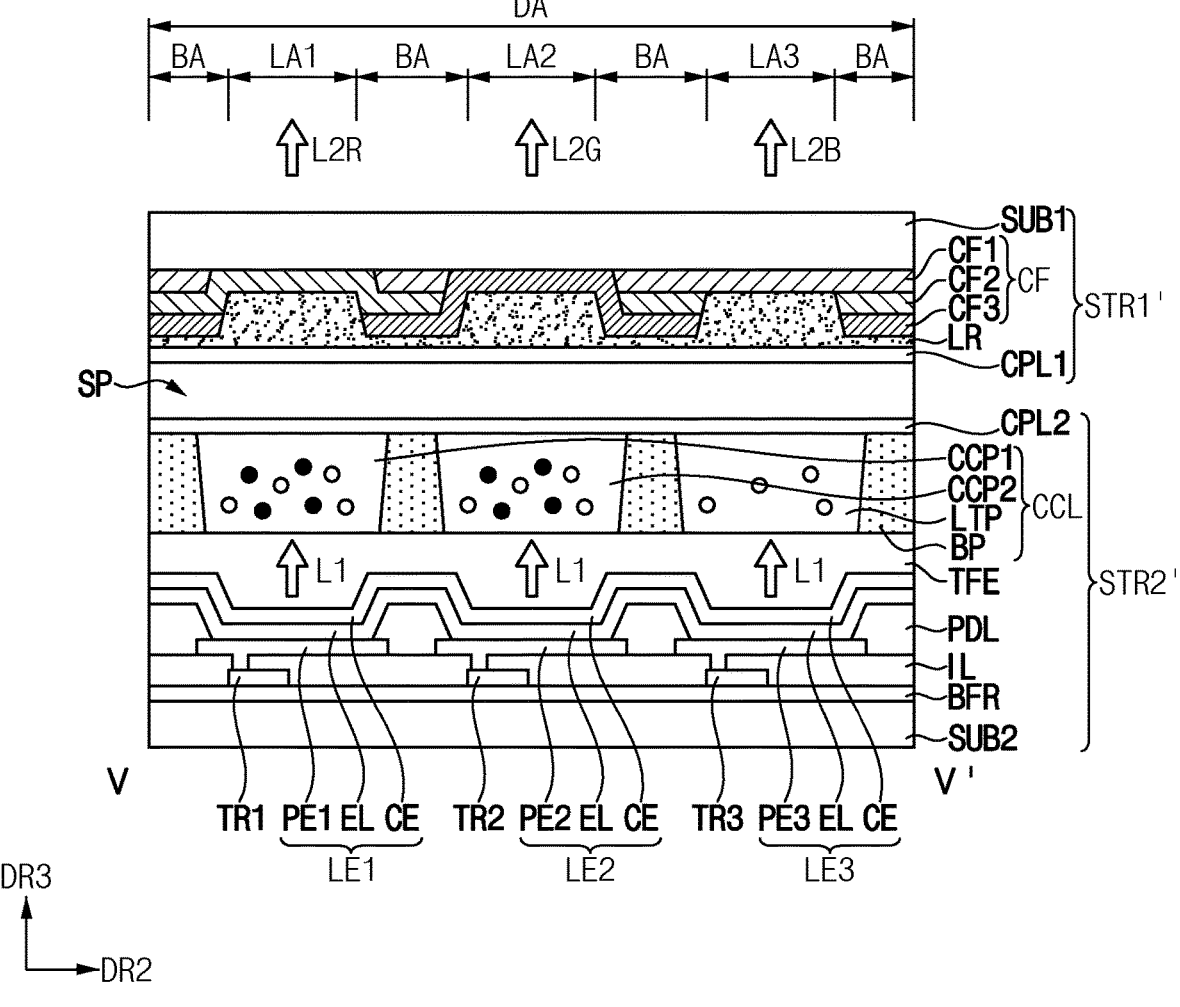
FIG. 13 is a cross-sectional view taken along the line V-V' of FIG. 11, according to some embodiments of the present disclosure.
Figure 14:
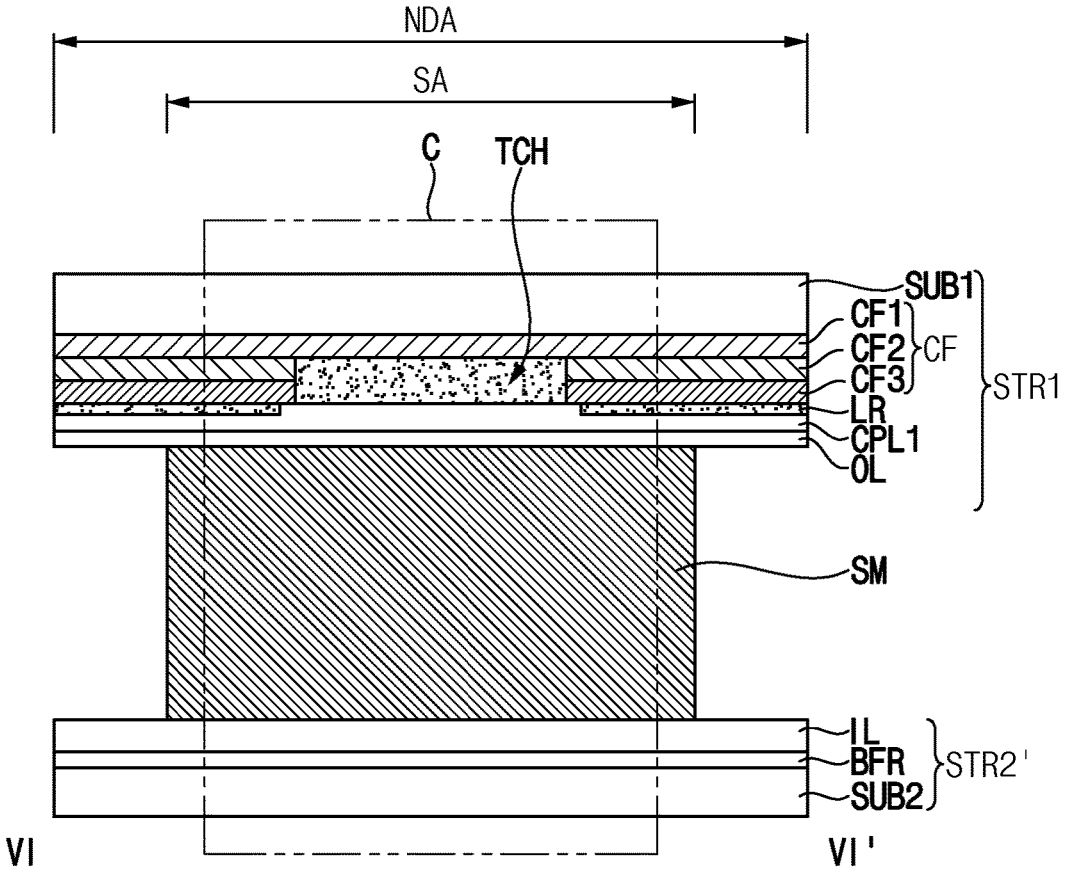
FIG. 14 is a cross-sectional view taken along the line VI-VI' of FIG. 11, according to some embodiments of the present disclosure.
Figure 14:
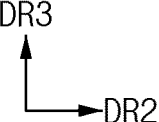
Figure 15:
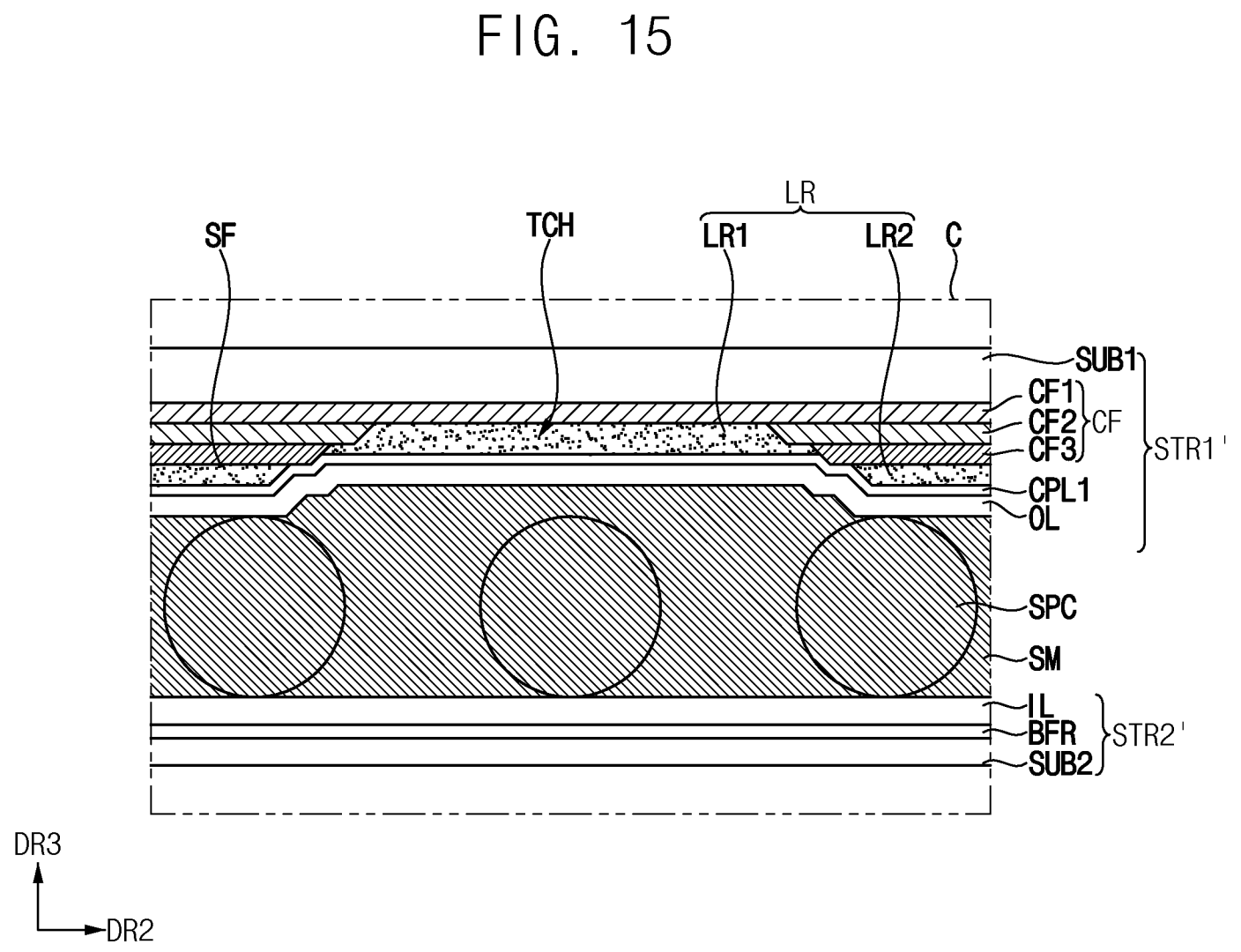

FIG. 11 is a plan view illustrating a display device according to some other embodiments of the present disclosure. FIG. 12 is a cross-sectional view taken along the line IV-IV' of FIG. 11, according to some embodiments of the present disclosure. FIG. 13 is a cross-sectional view taken along the line V-V' of FIG. 11, according to some embodiments of the present disclosure. FIG. 14 is a cross-sectional view taken along the line VI-VI' of FIG. 11, according to some embodiments of the present disclosure. FIG. 15 is an enlarged cross-sectional view of the area C of FIG. 14, according to some embodiments of the present disclosure.

For example, FIG. 13 may be a cross-sectional view illustrating an example of a display area DA included in a display device DD', and FIGS. 14 and 15 may be cross-sectional views illustrating an example of a sealing area SA included in the display device DD'.

The display device DD' described with reference to FIGS. 11, 12, 13, 14, and 15 may be substantially the same as or similar to the display device DD described with reference to FIGS. 1, 2, 3, 4, and 5, except for an arrangement of a color conversion layer CCL and a second capping layer CPL2.

Referring to FIGS. 11, 12, 13, 14, and 15, the display device DD' may include the display area DA and a non-display area NDA including the sealing area SA. In addition, the display device DD' may include a first structure STR1', a second structure STR2', and a sealing member SM.

In some embodiments, in the display area DA, the first structure STR1' includes a first substrate SUB1, a color filter layer CF, a refractive layer LR, and a first capping layer CPL1. The color filter layer CF, the refractive layer LR, and the first capping layer CPL1 may be sequentially disposed below the first substrate SUB1.

In some embodiments, in the display area DA, the second structure STR2' includes a second substrate SUB2, a buffer layer BFR, first, second, and third transistors TR1, TR2, and TR3, an insulating layer IL, a pixel defining layer PDL, first, second, and third light emitting elements LE1, LE2, and LE3, an encapsulation layer TFE, the color conversion layer CCL, and the second capping layer CPL2. The second structure STR2' may be disposed below the first structure STR1' with a space SP interposed therebetween. The buffer layer BFR, the first, second, and third transistors TR1, TR2, and TR3, the insulating layer IL, the pixel defining layer PDL, the first, second, and third light emitting elements LE1, LE2, and LE3, the encapsulation layer TFE, the color conversion layer CCL, and the second capping layer CPL2 may be sequentially disposed on the second substrate SUB2.

In some embodiments, in the sealing area SA, the first structure STR1' includes the first substrate SUB1, the color filter layer CF, the refractive layer LR, the first capping layer CPL1, and an organic layer OL. The color filter layer CF, the refractive layer LR, the first capping layer CPL1, and the organic layer OL may be sequentially disposed below the first substrate SUB1.

In the sealing area SA, the color filter layer CF may define a trench TCH recessed from a lower surface SF of the color filter layer CF in a direction (i.e., a third direction DR3) toward the first substrate SUB1.

The refractive layer LR may be disconnected by the trench TCH, and may include a first refractive layer LR1 and a second refractive layer LR2 spaced apart from each other. The first refractive layer LR1 may be disposed in the trench TCH of the color filter layer CF, and the second refractive layer LR2 may be disposed below the lower surface SF of the color filter layer CF. Accordingly, the refractive layer LR may expose a portion of the color filter layer CF.

The first capping layer CPL1 may be in contact with the portion of the color filter layer CF exposed by the refractive layer LR. Accordingly, an area with enhanced interlayer adhesive force may be formed in an area where the first refractive layer LR1 and the second refractive layer LR2 are spaced apart from each other.

In some embodiments, in the sealing area SA, the second structure STR2' includes the second substrate SUB2, the buffer layer BFR, and the insulating layer IL. The buffer layer BFR and the insulating layer IL may be sequentially disposed on the second substrate SUB2.

In the sealing area SA, the sealing member SM may couple the first structure STR1' and the second structure STR2' between the first structure STR1' and the second structure STR2'. The sealing member SM may include spacer particles SPC.

The cross-sectional structure of the sealing area SA of the display device DD' described with reference to FIGS. 14 and 15 is only an example, and the cross-sectional structure of the sealing area SA of the display device DD' may be variously changed in a suitable manner according to different embodiments. For another example, the structures of the display device DD described with reference to FIGS. 6, 7, 8, 9, and 10 may be applied to the cross-sectional structure of the sealing area SA of the display device DD'.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," "comprising," "has," "have," and "having," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. For example, the expression "A and/or B" denotes A, B, or A and B. Expressions such as "one or more of" and "at least one of," when preceding a list of elements, modify the entire list of elements and do not modify the individual elements of the list. For example, the expression "one or more of A, B, and C," "at least one of A, B, or C," "at least one of A, B, and C," and "at least one selected from the group consisting of A, B, and C" indicates only A, only B, only C, both A and B, both A and C, both B and C, or all of A, B, and C.

Further, the use of "may" when describing embodiments of the inventive concept refers to "one or more embodiments of the inventive concept."

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", "in contact with", "in direct contact with", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

When one or more embodiments may be implemented differently, a specific process order may be performed differently from the described order. For example, (i) the disclosed operations of a process are merely examples, and may involve various additional operations not explicitly covered, and (ii) the temporal order of the operations may be varied.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The foregoing is illustrative of embodiments and is not to be construed as limiting thereof. Although a few embodiments have been described, those skilled in the art will readily appreciate that many modifications are possible in the embodiments without materially departing from the novel teachings and features of the present inventive concept. Accordingly, all such modifications are intended to be included within the scope of the present inventive concept as defined by the claims and equivalents thereof. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims and equivalents thereof.

What is claimed is:

1. A display device comprising:
a substrate comprising a display area and a sealing area surrounding the display area;
a color filter layer below the substrate and defining at least one trench recessed from a lower surface of the color filter layer in a direction toward the substrate in the sealing area;
a refractive layer below the color filter layer; and
a capping layer below the refractive layer and in contact with at least a portion of the color filter layer in the sealing area.

2. The display device of claim 1, wherein the color filter layer comprises:
a first color filter below the substrate;
a second color filter below the first color filter; and
a third color filter below the second color filter.

3. The display device of claim 2, wherein the trench is recessed from a lower surface of the third color filter to a lower surface of the first color filter to expose the first color filter.

4. The display device of claim 2, wherein the trench is recessed from a lower surface of the third color filter to a lower surface of the second color filter to expose the second color filter.

5. The display device of claim 1, wherein the refractive layer is disconnected by the trench.

6. The display device of claim 5, wherein the refractive layer comprises:
a first refractive layer in the trench of the color filter layer; and
a second refractive layer spaced apart from the first refractive layer and below the lower surface of the color filter layer.

7. The display device of claim 1, wherein the capping layer comprises:
a first capping layer below the refractive layer; and
a second capping layer below the first capping layer.

8. The display device of claim 7, further comprising:
a scattering layer between the first capping layer and the second capping layer.

9. The display device of claim 1, wherein the refractive layer exposes a portion of the color filter layer, and
wherein the capping layer is in contact with the portion of the color filter layer exposed by the refractive layer.

10. The display device of claim 1, further comprising:
an organic layer below the capping layer.

11. A display device comprising:
a first substrate comprising a display area and a sealing area surrounding the display area;
a second substrate below the first substrate and facing the first substrate;
a color conversion layer between the first substrate and the second substrate and configured to convert a color of light emitted from a light emitting element that is positioned on the second substrate;
a color filter layer below the first substrate and defining at least one trench recessed from a lower surface of the color filter layer in a direction toward the first substrate in the sealing area;
a refractive layer below the color filter layer; and
a capping layer below the refractive layer and in contact with at least a portion of the color filter layer in the sealing area.

12. The display device of claim 11, wherein the color filter layer comprises:
a first color filter below the first substrate;
a second color filter below the first color filter; and
a third color filter below the second color filter.

13. The display device of claim 12, wherein the trench is recessed from a lower surface of the third color filter to a lower surface of the first color filter to expose the first color filter.

14. The display device of claim 12, wherein the trench is recessed from a lower surface of the third color filter to a lower surface of the second color filter to expose the second color filter.

15. The display device of claim 11, wherein the capping layer comprises:
a first capping layer below the refractive layer; and
a second capping layer below the first capping layer.

16. The display device of claim 15, further comprising:
a scattering layer between the first capping layer and the second capping layer.

17. The display device of claim 11, wherein the refractive layer comprises:
a first refractive layer in the trench of the color filter layer; and a second refractive layer spaced apart from the first refractive layer and positioned below the lower surface of the color filter layer.

18. The display device of claim 11, wherein the refractive layer exposes a portion of the color filter layer, and wherein the capping layer is in contact with the portion of the color filter layer exposed by the refractive layer.

19. The display device of claim 11, further comprising: a sealing member along the sealing area between the first substrate and the second substrate, wherein the sealing member comprises spacer particles and couples the first substrate and the second substrate.

20. The display device of claim 11, further comprising: an organic layer below the capping layer.

\* \* \* \* \*